(12) United States Patent
Kawahara et al.

(10) Patent No.: US 11,335,629 B2
(45) Date of Patent: May 17, 2022

(54) TRANSFER-MOLD TYPE POWER MODULE AND LEAD FRAME

(71) Applicant: Mitsubishi Electric Corporation, Tokyo (JP)

(72) Inventors: Fumihito Kawahara, Tokyo (JP); Keitaro Ichikawa, Tokyo (JP); Yuji Shikasho, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/099,985

(22) Filed: Nov. 17, 2020

(65) Prior Publication Data

US 2021/0249341 A1      Aug. 12, 2021

(30) Foreign Application Priority Data

Feb. 12, 2020   (JP) .............................. JP2020-021285

(51) Int. Cl.
  *H01L 23/495*   (2006.01)
  *H01L 23/31*    (2006.01)
(52) U.S. Cl.
  CPC .... *H01L 23/49555* (2013.01); *H01L 23/3107* (2013.01)

(58) Field of Classification Search
  CPC ...................... H01L 23/49555; H01L 23/3107
  See application file for complete search history.

(56) References Cited

U.S. PATENT DOCUMENTS 9,806,008 B1 * 10/2017 Adriano .................. H01L 25/16
2008/0087901 A1 * 4/2008 Sata ....................... H01L 25/167
                                                                257/82

FOREIGN PATENT DOCUMENTS

JP         2002-076231 A      3/2002

* cited by examiner

*Primary Examiner* — Marc Anthony Armand
(74) *Attorney, Agent, or Firm* — Studebaker & Brackett PC

(57) ABSTRACT

A transfer-mold type power module includes a plurality of electrode terminals that is arranged so as to protrude in the same direction from a target side surface of a package. A tie bar cutting residue protruding from a first side surface of each of the electrode terminals and a tie bar cutting residue protruding from a second side surface of each of the electrode terminals are different in position in a length direction of each of the electrode terminals. Each of the electrode terminals has a shape bent at a position including tie bar cutting residue closer to the package, with a width direction of each of the electrode terminals as an axis.

3 Claims, 20 Drawing Sheets

TRANSFER-MOLD TYPE POWER MODULE AND LEAD FRAME

BACKGROUND OF THE INVENTION

Field of the Invention

The present disclosure relates to a shape of a lead frame that includes an electrode terminal in a transfer-mold type intelligent power module. In the transfer-mold type intelligent power module, a power unit and a control unit are mounted in the same package, and each of both sides of a body of the package is provided with an electrode terminal.

Description of the Background Art

As one of techniques for manufacturing a packaged semiconductor apparatus, a transfer molding method is known (for example, Japanese Patent Application Laid-Open No. 2002-76231). With the transfer molding method, a semiconductor device mounted on a lead frame is sealed with resin.

In a transfer-mold type intelligent power module (IPM), a power unit and a control unit are mounted in the same package, and each of both sides of a body of resin is provided with an electrode terminal. Because an electrode terminal for a control unit normally sends a small current, the electrode terminal is designed to be thinner than an electrode terminal for a power unit. In order to attach the transfer-mold type IPM to a control board, an electrode terminal protruding from the package is bent upward at a substantially right angle near the package. This bending forming of an electrode terminal is called lead forming. A tip end portion of the electrode terminal is thinner than a bending position of the electrode terminal.

Each of the electrode terminals is linked to one another by a tie bar. The tie bar is cut off during terminal molding to separate each of the electrode terminals. Generally, strength of a bent portion of an electrode terminal is maintained by thickening a tie bar and bending a portion of the electrode terminal, which has been linked by the tie bar (hereinafter referred to as "tie bar connection part") after cutting off the tie bar.

When cutting off a tie bar by a cutting punch or the like, some cutting residue (hereinafter referred to as "tie bar cutting residue") may accrue. As a result, a tie bar connection part of an electrode terminal may have a shape in which tie bar cutting residue is adhered to both sides of the tie bar connection part, by which the tie bar connection part may become wider than a root part of the electrode terminal.

When the electrode terminal is bent, compressive stress may act on an inside portion of the bent electrode terminal, and the inside portion may become wider by overhanging in a width direction of the electrode terminal. Therefore, there has been a problem that, when a lead forming operation is applied to a tie bar connection part of an electrode terminal, an increase in width caused by tie bar cutting residue and an increase in width caused by the overhanging overlap each other to reduce a distance between electrode terminals, failing to ensure an insulation clearance distance.

SUMMARY

An object of the technique of the present disclosure is to ensure an insulation clearance distance between electrode terminals in a transfer-mold type power module, while maintaining strength of a bent portion of each of the electrode terminals, which is bent by a lead forming operation.

A first lead frame of the present disclosure is a lead frame for a transfer-mold type power module. The first lead frame includes a plurality of electrode terminals and a tie bar. The plurality of electrode terminals is arranged so as to protrude in the same direction from a target side surface of a package that seals a power semiconductor device with resin. The tie bar links two electrode terminals adjacent to each other. Each of the electrode terminals has a first side surface and a second side surface opposite to the first side surface. The first side surface faces, and is linked by the tie bar to, another adjacent electrode terminal. The second side surface faces another electrode terminal that is different from the another electrode terminal facing the first side surface, and is linked to the former another electrode terminal by a tie bar. In each of the electrode terminals, a connection point for the tie bar on the first side surface and a connection point for the tie bar on the second side surface are different in position in a length direction of each of the electrode terminals.

With the first lead frame of the present disclosure, tie bar cutting residue is not present or is present either on the first side surface or on the second side surface at a point to which a lead forming operation is applied in an electrode terminal. Therefore, at least either on the first side surface or on the second side surface, an overhang portion caused by a lead forming operation and a position of tie bar cutting residue do not overlap each other. Therefore, it is possible to increase a distance between two electrode terminals adjacent to each other and to ensure an insulation clearance distance between the electrode terminals.

A second lead frame of the present disclosure is a lead frame for a transfer-mold type power module. The second lead frame includes a plurality of electrode terminals and a frame. The plurality of electrode terminals is arranged so as to protrude in the same direction from a target side surface of a package that mounts a power semiconductor device. The frame links end parts of each of the electrode terminals across the package, and surrounds the package. Each of the electrode terminal is linked to another electrode terminal adjacent by the frame alone. Each of the electrode terminals has a first side surface and a second side surface opposite to the first side surface. The first side surface faces another adjacent electrode terminal. The second side surface faces another electrode terminal that is different from the another electrode terminal facing the first side surface. Each of the electrode terminals has a slit formed along the first side surface and a slit formed along the second side surface except for a root part that is the end part on a package side.

With the second lead frame of the present disclosure, tie bar cutting residue is not present or is present either on the first side surface or on the second side surface at a point to which a lead forming operation is applied in an electrode terminal. Therefore, at least either on the first side surface or on the second side surface, an overhang portion caused by a lead forming operation and a position of tie bar cutting residue do not overlap each other. Therefore, it is possible to increase a distance between two electrode terminals adjacent to each other and to ensure an insulation clearance distance between the electrode terminals.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

A. Base Technology

Figure 1:
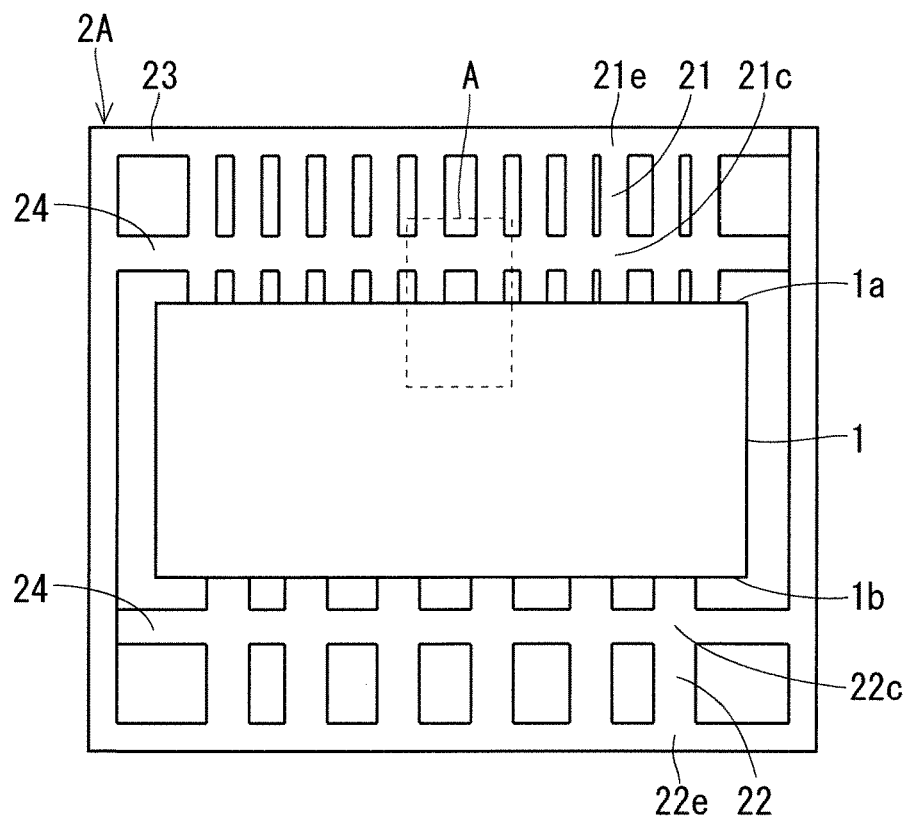
FIG. 1 is a top view illustrating a transfer-mold type IPM according to a base technology before electrode terminal molding.

FIG. 1 is a top view of a transfer-mold type IPM according to a base technology before electrode terminal molding. The transfer-mold type IPM is an example of a transfer-mold type power module. An electrode terminal of the transfer-mold type IPM according to the base technology is molded out of a lead frame 2A. In FIG. 1, the lead frame 2A includes a plurality of electrode terminals 21, 22, a frame 23, a tie bar 24, and a die pad (not illustrated). The die pad mounts a power semiconductor device. The power semiconductor device mounted on the die pad is sealed by a package 1 molded with resin. The electrode terminals 21 protrude in the same direction from one side surface of the die pad, and the electrode terminals 22 protrude in the same direction from another side surface of the die pad. These electrode terminals 21, 22 are exposed from a side surface 1a, 1b of the package 1. In other words, the plurality of electrode terminals 21 protrudes in the same direction from the side surface 1a of the package 1, and the plurality of electrode terminals 22 protrudes in the same direction from the side surface 1b of the package 1. Hereinafter, the side surface 1a, 1b of the package 1 is also referred to as a target side surface.

The electrode terminals 21 are electrode terminals for a control unit and thus send smaller current than the electrode terminals 22, which are for a power unit, send. Therefore, the electrode terminals 21 are designed to be thinner than the electrode terminals 22. Electrode terminals 21 adjacent to each other and electrode terminals 22 adjacent to each other are linked by the frame 23 at a tip end 21e, 22e, respectively, and are also linked by a tie bar 24 at an inner side than the tip end 21e, 22e, respectively. The frame 23 surrounds the package 1 on all sides. A portion of each of the electrode terminals 21, 22, which is linked by the tie bar 24, is referred to as a tie bar connection part 21c, 22c, respectively.

Figure 2:
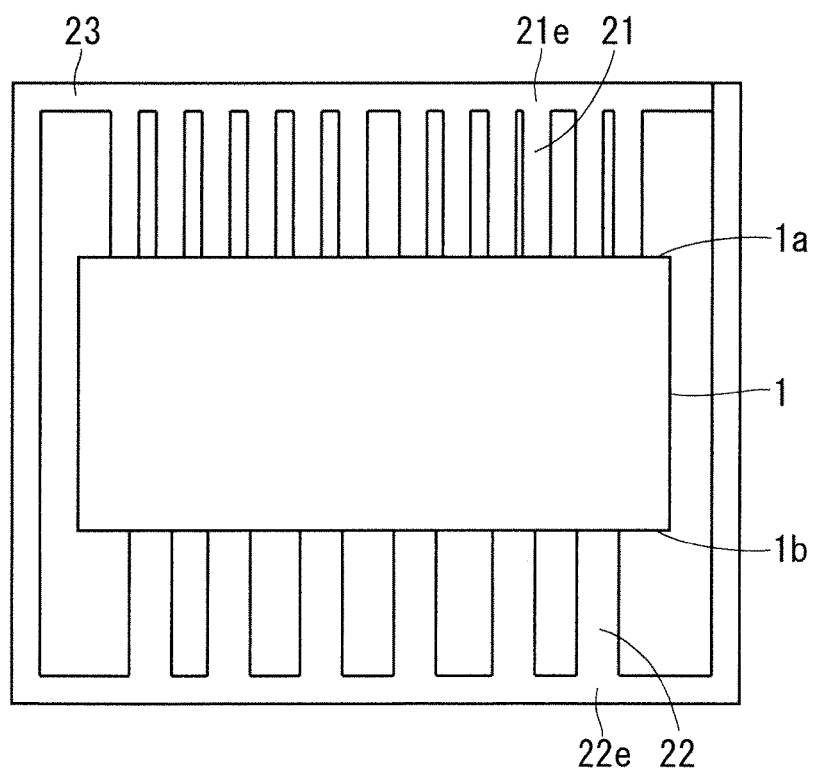
FIG. 2 is a top view illustrating the transfer-mold type IPM according to the base technology after tie bars are cut off.
Figure 3:
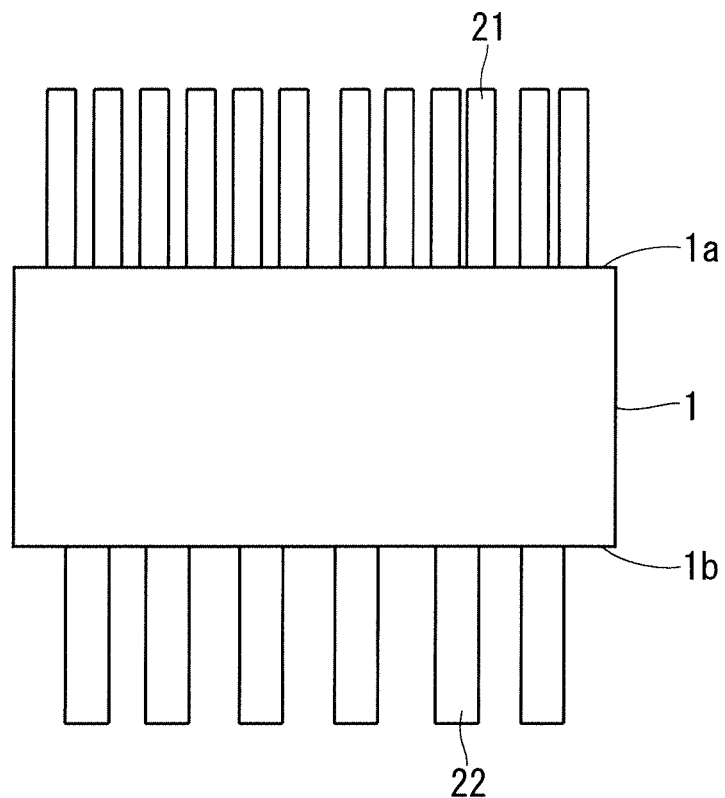
FIG. 3 is a top view illustrating the transfer-mold type IPM according to the base technology after a frame is cut off.
Figure 4:
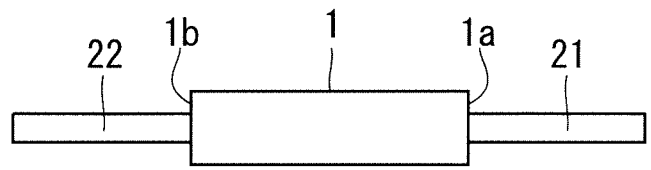
FIG. 4 is a side view illustrating the transfer-mold type IPM according to the base technology after the frame is cut off.
Figure 5:
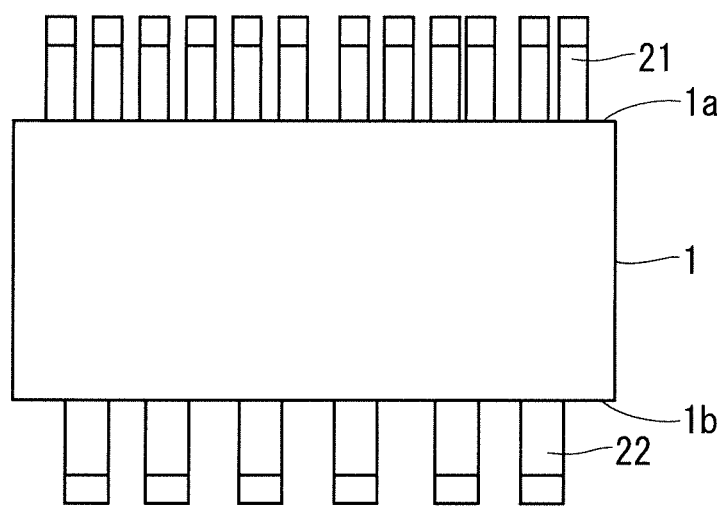
FIG. 5 is a top view illustrating the transfer-mold type IPM according to the base technology after lead forming.
Figure 6:
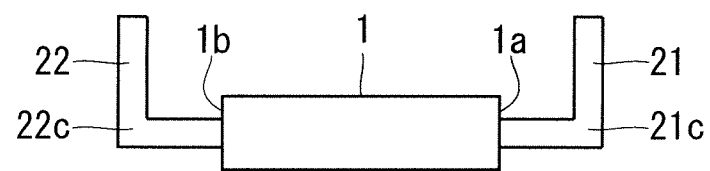
FIG. 6 is a side view illustrating the transfer-mold type IPM according to the base technology after the lead forming.

An electrode terminal of the transfer-mold type IPM according to the base technology is molded through processes illustrated in FIGS. 2 to 6. First, the tie bars 24 are cut off as illustrated in FIG. 2. FIG. 2 is a top view of the transfer-mold type IPM according to the base technology after the tie bars 24 are cut off. Next, as illustrated in FIG. 3, the frame 23 is cut off, and the electrode terminals 21, 22 are separated from each other. FIG. 3 illustrates a top view of and FIG. 4 illustrates a side view of the transfer-mold type IPM according to the base technology after the frame 23 is cut off. Next, as illustrated in FIG. 5, a lead forming operation is applied to each of the electrode terminals 21, 22, that is, the electrode terminals 21, 22 are bent upward at the tie bar connection part 21c, 22c, respectively. FIG. 5 illustrates a top view of and FIG. 6 illustrates a side view of the transfer-mold type IPM according to the base technology after the lead forming. FIG. 6 illustrates the electrode terminals 21, 22 bent at a right angle. However, each of the electrode terminals 21, 22 is only required to be bent upward with a width direction of each of the electrode terminals 21, 22 as an axis, and may be bent in a gull wing shape, for example.

Figure 7:
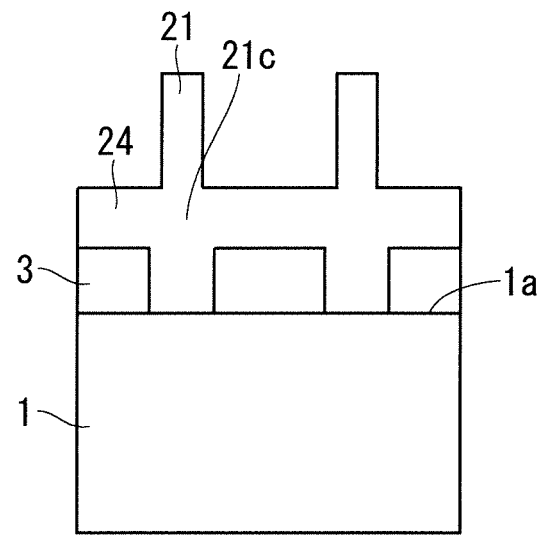
FIG. 7 is a top view illustrating a main part of the transfer-mold type IPM according to the base technology.
Figure 8:
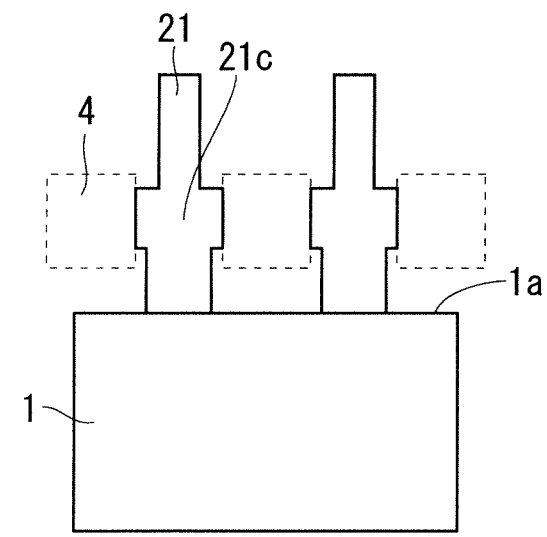
FIG. 8 is a top view illustrating the transfer-mold type IPM according to the base technology after excess resin is removed.
Figure 9:
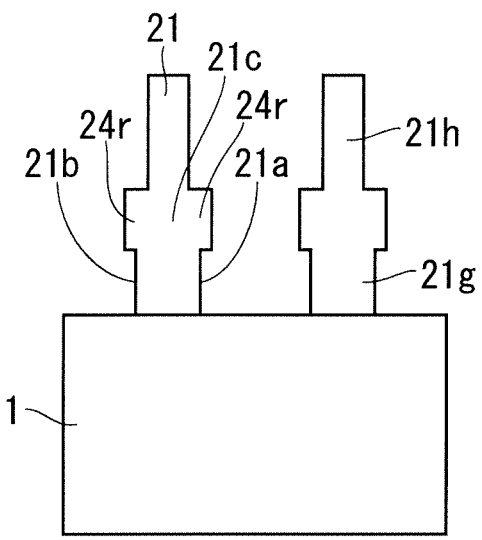
FIG. 9 is a top view illustrating the transfer-mold type IPM according to the base technology after a tie bar is cut off.

FIGS. 7 to 9 illustrate a region A in FIG. 1 in a process of cutting off a tie bar 24. FIG. 7 illustrates two electrode terminals 21. Each of the electrode terminals 21 has a first side surface 21a and a second side surface 21b that face another adjacent electrode terminal 21. A first side surface 21a of the electrode terminal 21 on a left side faces a second side surface 21b of the electrode terminal 21 on a right side. A second side surface 21b opposite to the first side surface 21a of the electrode terminal 21 on the left side faces a first side surface 21a of another adjacent electrode terminal 21 on the further left side (not illustrated in FIG. 7). In each of the electrode terminals 21, a tie bar 24 is connected to the first side surface 21a and to the second side surface 21b at the tie bar connection part 21c. Thus, an electrode terminal 21 is linked to another adjacent electrode terminal 21.

The tie bar 24 serves as a dam that blocks resin flowing to an outside when the package 1 is molded. There may be excess resin 3, which is unnecessary for the package 1, between the tie bar 24 and the package 1. This excess resin 3 is cut off with a cutting punch. Next, as illustrated in FIG. 8, the tie bar 24 is cut off with cutting punch 4. At this time, cutting residue of the tie bar 24 accrues. Hereinafter cutting residue of a tie bar is referred to as "tie bar cutting residue". As illustrated in FIG. 9, the tie bar connection part 21c of the electrode terminal 21 has tie bar cutting residue 24r protruding from the first side surface 21a and the second side surface 21b. As a result, the tie bar connection part 21c of the electrode terminal 21 is wider than a root part 21g closer to a root side.

Figure 10:
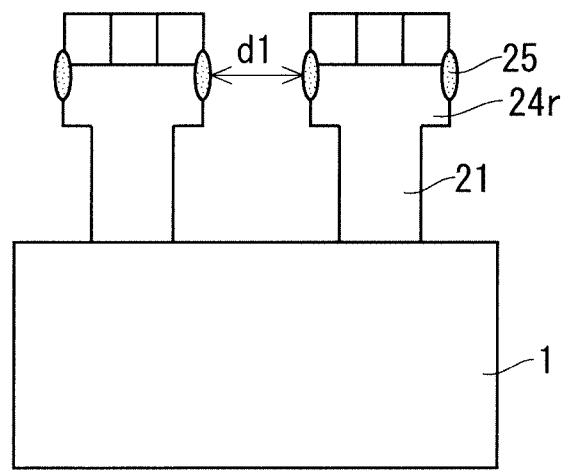
FIG. 10 is a top view illustrating the transfer-mold type IPM according to the base technology after the lead forming.
Figure 11:
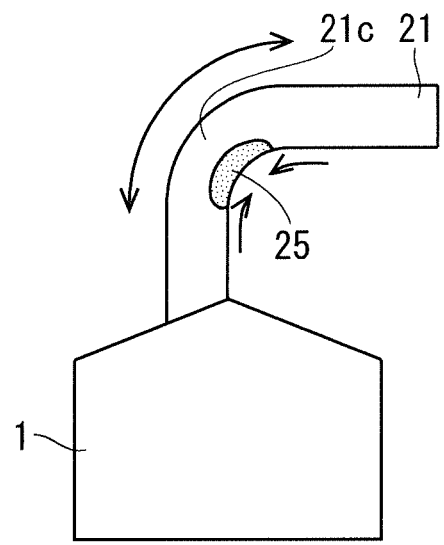
FIG. 11 is a side view illustrating the transfer-mold type IPM according to the base technology after the lead forming.

Next, a lead forming operation is applied to the electrode terminal 21 at the tie bar connection part 21c. FIG. 10 illustrates a top view of the electrode terminal 21 to which the lead forming operation has been applied. FIG. 11 illustrates a side view of the electrode terminal 21 viewed from a side of the second side surface 21b. When the electrode terminal 21 is bent, compressive stress is applied to an inside of a bend as illustrated in FIG. 11. Then, a portion to which the compressive stress is applied spreads in the width direction of the electrode terminal 21, by which an overhang portion 25 is formed. Because there is tie bar cutting residue 24r on both the first side surface 21a and the second side surface 21b at the tie bar connection part 21c, the overhang portion 25 is formed further protruding from the tie bar cutting residue 24r in the width direction of the electrode terminal 21. Accordingly, positions of the tie bar cutting residue 24r and overhang portion 25 in a length direction of the electrode terminals 21 overlap each other on both the first side surface 21a and the second side surface 21b. Therefore, a distance d1 between the electrode terminals 21 is decreased, causing difficulty in ensuring an insulation clearance distance.

Thus, according to each of the preferred embodiments described below, an insulation clearance distance between electrode terminals in a transfer-mold type power module is ensured, while bending strength of the electrode terminals is maintained. In each of the following preferred embodiments, configurations that are the same as or corresponding to configurations in the base technology are given the same reference signs.

B. First Preferred Embodiment

B-1. Lead Frame

In a first preferred embodiment, when molding an electrode terminal of a transfer-mold type IPM, a lead frame 2B having a shape different from a shape of the lead frame 2A according to the base technology is used.

Figure 12:
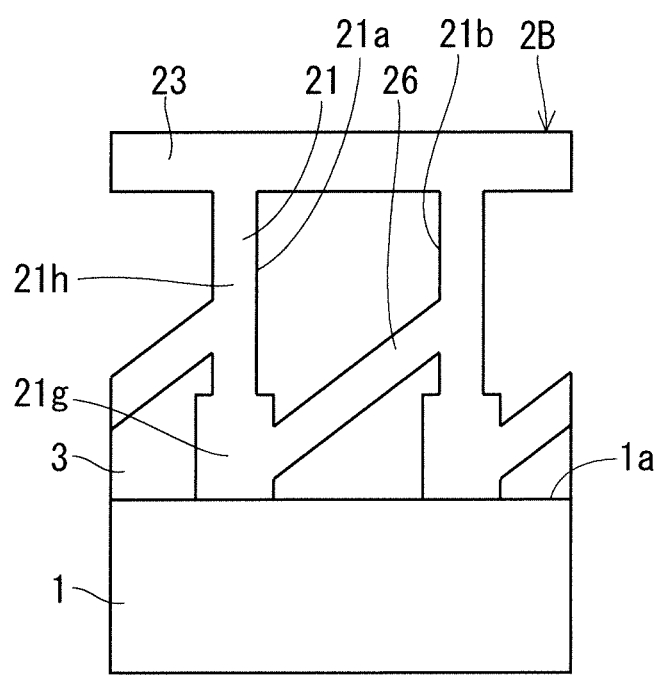
FIG. 12 is a top view illustrating a transfer-mold type IPM according to a first preferred embodiment before electrode terminal molding.

FIG. 12 is a partial top view of the transfer-mold type IPM according to the first preferred embodiment before electrode terminal molding. An electrode terminal of the transfer-mold type IPM according to the first preferred embodiment is molded out of the lead frame 2B. The lead frame 2B is different from the lead frame 2A according to the base technology in that a tie bar 26 is included instead of the tie bar 24.

The tie bar 26 links electrode terminals 21 adjacent to each other and links electrode terminals 22 (refer to FIG. 1) adjacent to each other. FIG. 12 illustrates a configuration related to an electrode terminal 21. However, a configuration related to an electrode terminal 22 is similar to the configuration related to the electrode terminal 21.

As illustrated in FIG. 12, each of the electrode terminals 21 includes a root part 21g on a side of a package 1 and a tip end part 21h, which is narrower than the root part 21g, on a tip end side. One tie bar 26 connects a first side surface 21a of the root part 21g of each of the electrode terminals 21 and a second side surface 21b of the tip end part 21h of another electrode terminal 21 facing the first side surface 21a of each of the electrode terminals 21. That is, the tie bar 26 connecting the two electrode terminals 21 adjacent to each other is connected to a root part 21g of one electrode terminal 21 and is connected to a tip end part 21h closer to a tip end side than a root part 21g of another electrode terminal 21. As described above, in each of the electrode terminals 21, a connection position for the tie bar on the first side surface 21a and a connection position for the tie bar on the second side surface 21b are different in position in a length direction of each of the electrode terminals 21.

Further, regarding one electrode terminal 21, each of the electrode terminals 21 is connected to the tie bar 26 at the root part 21g on the first side surface 21a and is connected to the tie bar 26 at the tip end part 21h on the second side surface 21b. In this way, each of the electrode terminals 21 is designed so that connection positions for the tie bar 26 on the first side surface 21a and on the second side surface 21b are different in position in the length direction of each of the electrode terminals 21.

In FIG. 12, the tie bar 26 has a shape that connects the electrode terminals 21 in a straight line. In other words, the tie bar 26 is an oblique tie bar having an inclination with respect to a width direction of the electrode terminals 21.

B-2. Terminal Molding Process

Figure 13:
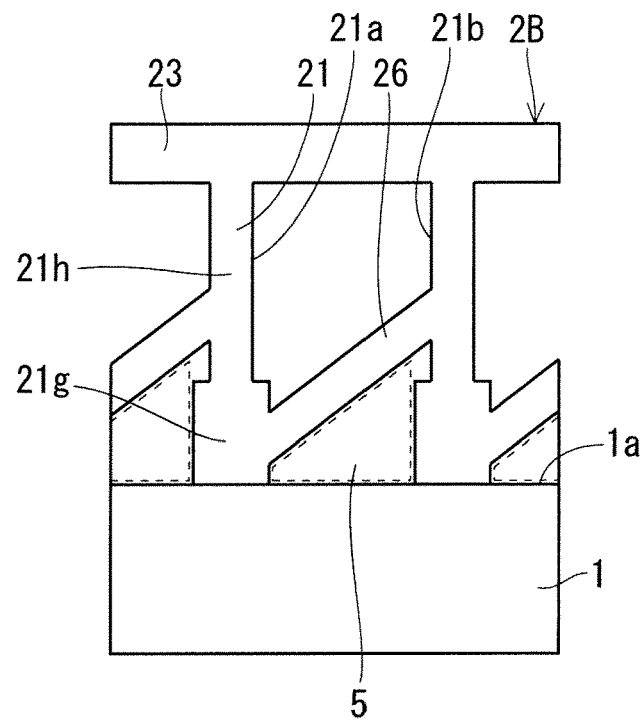
FIG. 13 is a view illustrating removal of excess resin by cutting punch in an electrode terminal molding process of the transfer-mold type IPM according to the first preferred embodiment.
Figure 14:
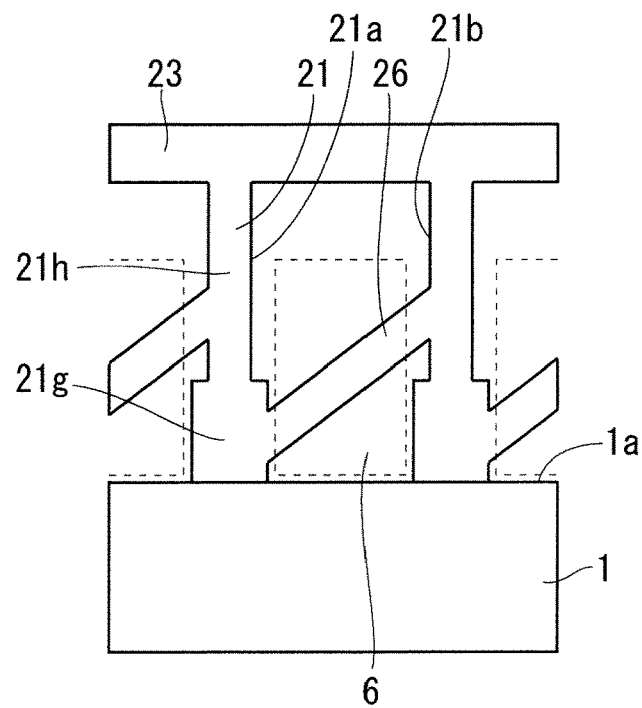
FIG. 14 is a view illustrating cutting off of a tie bar by cutting punch in the electrode terminal molding process of the transfer-mold type IPM according to the first preferred embodiment.
Figure 15:
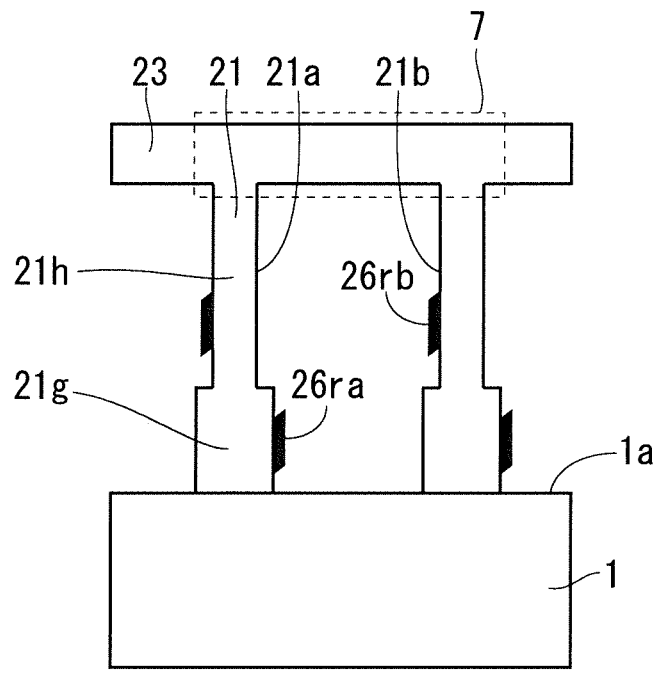
FIG. 15 is a top view illustrating the transfer-mold type IPM according to the first preferred embodiment after a tie bar is cut off.

An electrode terminal molding process of the transfer-mold type IPM according to the first preferred embodiment will be described below. First, as illustrated in FIG. 13, excess resin 3 between the package 1 and the tie bar 26 is cut off by cutting punch 5. Then, as illustrated in FIG. 14, the tie bar 26 is cut off by cutting punch 6. At this time, not an entire of the tie bar 26 is cut off, and cutting residue accrues. That is, as illustrated in FIG. 15, tie bar cutting residue 26ra is adhered to the root part 21g on the first side surface 21a of the electrode terminal 21, and tie bar cutting residue 26rb is adhered to the tip end part 21h on the second side surface 21b of the electrode terminal 21. As described above, the tie bar cutting residue 26ra protruding from the first side surface 21a of the electrode terminal 21 and the tie bar cutting residue 26rb protruding from the second side surface 21b of the electrode terminal 21 are different in position in a length direction of the electrode terminal 21. Further, also between two electrode terminals 21 adjacent to each other, the tie bar cutting residue 26ra, 26rb protruding from the first side surface 21a and the second side surface 21b facing each other, respectively, are different in position in the length direction of the electrode terminals 21.

Next, a frame 23 is cut off by cutting punch 7. As a result, as illustrated in FIG. 16, a link between electrode terminals 21 adjacent to each other is released.

Figure 16:
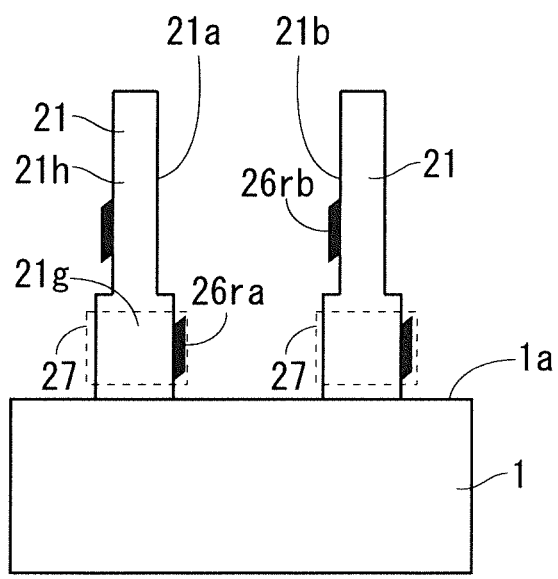
FIG. 16 is a top view illustrating the transfer-mold type IPM according to the first preferred embodiment after a frame is cut off.

Next, a lead forming operation is applied to a broken-line region 27 including the tie bar cutting residue 26ra on the root part 21g illustrated in FIG. 16. In other words, a lead forming operation is applied to the electrode terminal 21 at a position closer to the root side among the two tie bar cutting residue 26ra, 26rb, that is, a position closer to the package 1 and including the tie bar cutting residue 26ra.

Figure 17:
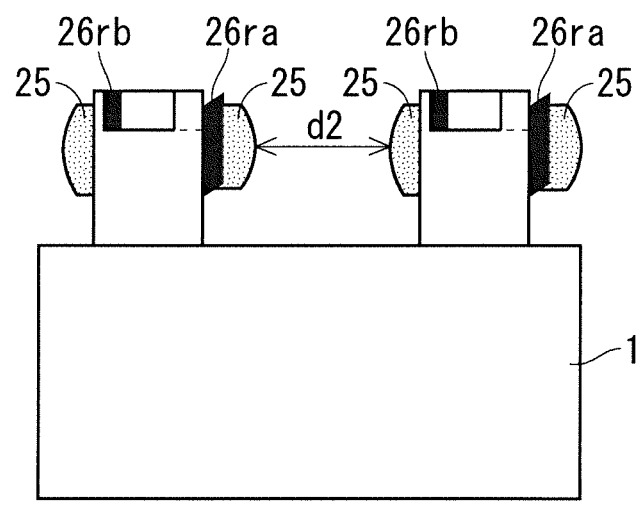
FIG. 17 is a top view illustrating the transfer-mold type IPM according to the first preferred embodiment after lead forming.
Figure 18:
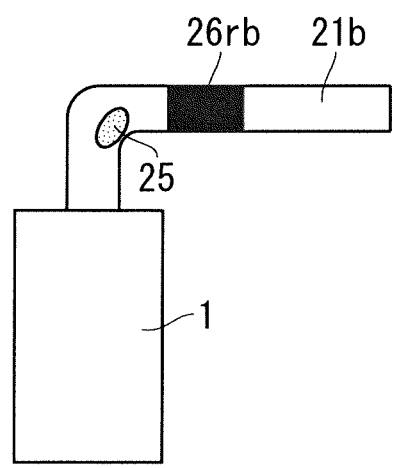
FIGS. 18 and 19 are side views each illustrating the transfer-mold type IPM according to the first preferred embodiment after the lead forming.
Figure 19:
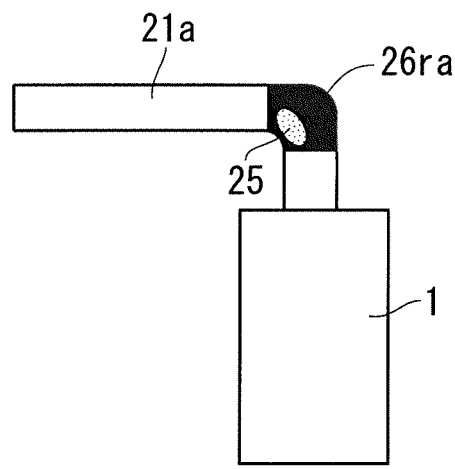
Figure 20:
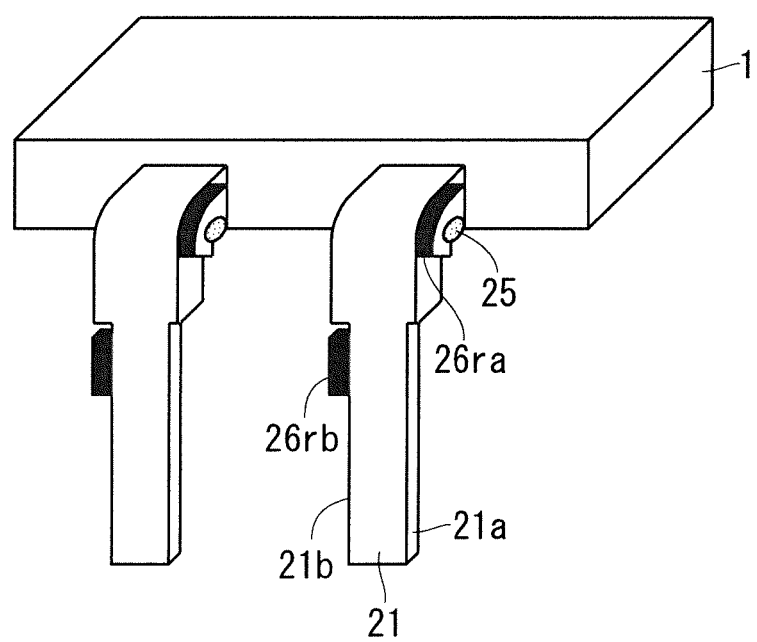
FIG. 20 is a perspective view illustrating the transfer-mold type IPM according to the first preferred embodiment after the lead forming.

FIGS. 17 to 20 illustrate the transfer-mold type IPM according to the first preferred embodiment after lead forming. FIG. 17 is a top view. FIG. 18 is a side view of the electrode terminal 21 viewed from a side of the second side surface 21b. FIG. 19 is a side view of the electrode terminal 21 viewed from a side of the first side surface 21a. FIG. 20 is a perspective view. A lead forming operation is applied to the first side surface 21a of the electrode terminal 21 at a portion where the tie bar cutting residue 26ra is present. Therefore, an overhang portion 25 protrudes from the tie bar cutting residue 26ra. Meanwhile, a lead forming operation is applied to the second side surface 21b of the electrode terminal 21 at a portion where tie bar cutting residue 26rb is not present. Therefore, the overhang portion 25 protrudes from the second side surface 21b. Accordingly, width of the electrode terminal 21 at a portion where the overhang portion 25 is formed is narrow by width of the tie bar cutting residue 26rb that is not present, as compared to a case of the base technology. As a result, a distance d2 between electrode terminals 21 adjacent to each other is longer than the distance d1 in the base technology, and an insulation clearance distance between the electrode terminals 21 is ensured.

B-3. Modification

In FIG. 12, the tie bar 26 having an oblique diagonal shape, which connects electrode terminals 21 adjacent to each other in a straight line, is illustrated. However, the tie bar 26 may have another shape, as long as the tie bar 26 connects the electrode terminals 21 adjacent to each other at two points, typically the root part 21g and the tip end part 21h, which are different in position in the length direction of the electrode terminals 21.

Figure 21:
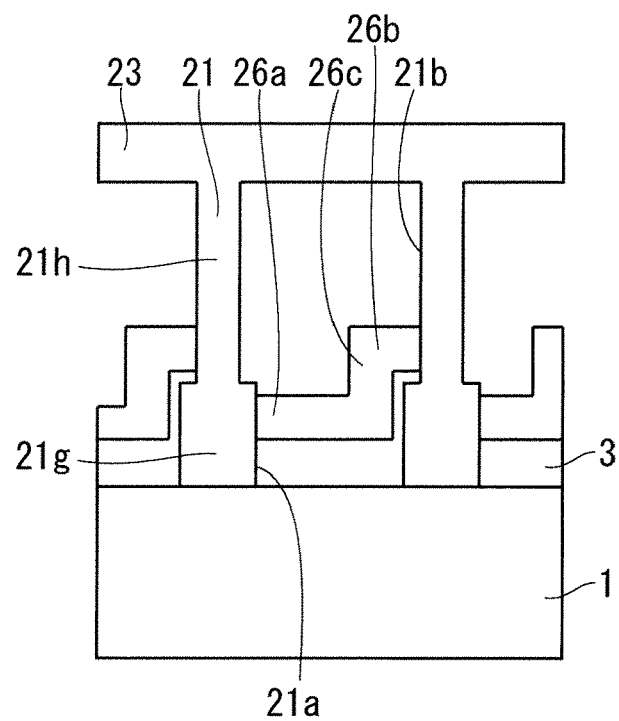
FIG. 21 is a top view illustrating the transfer-mold type IPM according to a modification of the first preferred embodiment before electrode terminal molding.
Figure 22:
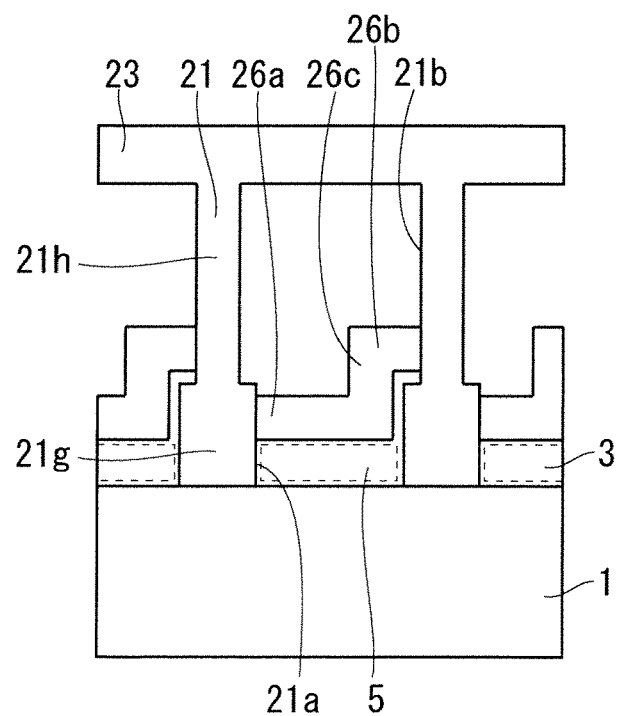
FIG. 22 is a view illustrating removal of excess resin by cutting punch in the electrode terminal molding process of the transfer-mold type IPM according to the modification of the first preferred embodiment.

For example, as illustrated in FIG. 21, the tie bar 26 may include a first portion 26a and a second portion 26b that are parallel to the width direction of the electrode terminals 21, and a third portion 26c that is parallel to the length direction of the electrode terminals 21. The first portion 26a is connected to the first side surface 21a on the root part 21g of one electrode terminal 21, the second portion 26b is connected to the second side surface 21b on the tip end part 21h of another electrode terminal 21, and the third portion 26c links the first side surface 21a and the second side surface 21b. Even in a case where a tie bar 26 having the above-described shape is used, excess resin 3 is cut off by cutting punch 5 as illustrated in FIG. 22.

In a case where a tie bar 26 having the shape illustrated in FIG. 21 is adopted, amount of the excess resin 3 can be minimized by shortening the second portion 26b as much as possible and reducing width between the third portion 26c and the second side surface 21b of the electrode terminal 21. The width between the third portion 26c of the tie bar 26 and the second side surface 21b of the electrode terminal 21 is preferably 0.05 mm or more and 0.20 mm or less in consideration of accuracy of cutting off the tie bar 26.

B-4. Effects

As described above, the transfer-mold type power module according to the first preferred embodiment includes the package 1 that seals a power semiconductor device with resin, and a plurality of electrode terminals 21 arranged so as to protrude in the same direction from a target side surface 1a of the package 1, in which each of the electrode terminals 21 has the first side surface 21a facing another of the electrode terminals 21 that is adjacent, and the second side surface 21b opposite to the first side surface 21a, the second side surface 21b facing another of the electrode terminals 21 that is different from the another electrode terminal 21 that the first side surface 21a faces, each of the electrode terminals 21 has the tie bar cutting residue 26ra, 26rb protruding from the first side surface 21a and the second side surface 21b, respectively, the tie bar cutting residue 26ra protruding from the first side surface 21a of each of the electrode terminals 21 and the tie bar cutting residue 26rb protruding from the second side surface 21b of each of the electrode terminals 21 are different in position in the length direction of each of the electrode terminals 21, and each of the electrode terminals 21 has a shape bent at a position including tie bar cutting residue closer to the package 1, with a width direction of each of the electrode terminals 21 as an axis. Therefore, with the transfer-mold type power module according to the first preferred embodiment, the overhang portion 25 of the electrode terminal 21 caused by a lead forming operation does not overlap with tie bar cutting residue either on the first side surface 21a or on the second side surface 21b. Therefore, the distance d1 between electrode terminals 21 is increased, allowing to ensure an insulation clearance distance between the electrode terminals 21.

The lead frame 2B for the transfer-mold type power module according to the first preferred embodiment includes the plurality of electrode terminals 21 arranged so as to protrude in the same direction from the target side surface 1a of the package 1 that seals the power semiconductor device with resin, and the tie bar 26 that links two electrode terminals 21 adjacent to each other. Each of the electrode terminals 21 has a first side surface 21a facing, and being linked by the tie bar 26 to, another adjacent electrode terminal 21, and a second side surface 21b opposite to the first side surface 21a, the second side surface 21b facing, and being linked by the tie bar 26 to, another electrode terminal 21 that is different from the another electrode terminal 21 that the first side surface 21a faces. In each of the electrode terminals 21, a connection point for the tie bar 26 on the first side surface 21a and a connection point for the tie bar 26 on the second side surface 21b are different in position in the length direction of each of the electrode terminals 21. Therefore, if the electrode terminals 21 of the transfer-mold type power module is molded with the lead frame 2B, an overhang portion 25 of the electrode terminal 21 caused by lead forming operation does not overlap with tie bar cutting residue either on the first side surface 21a or on the second side surface 21b. Therefore, the distance d1 between electrode terminals 21 is increased, allowing to ensure an insulation clearance distance between the electrode terminals 21.

C. Second Preferred Embodiment

C-1. Lead Frame

In a second preferred embodiment, when molding an electrode terminal of a transfer-mold type IPM, a lead frame 2C having a shape different from a shape of the lead frame 2A according to the base technology is used.

Figure 23:
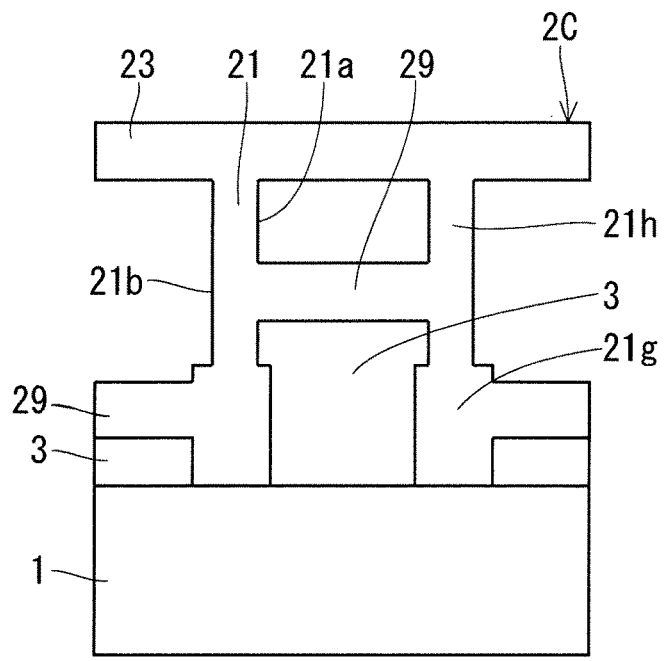
FIG. 23 is a top view illustrating a transfer-mold type IPM according to a second preferred embodiment before electrode terminal molding.

FIG. 23 is a partial top view of the transfer-mold type IPM according to the second preferred embodiment before electrode terminal molding. An electrode terminal of the transfer-mold type IPM according to the second preferred embodiment is molded out of the lead frame 2C. The lead frame 2C is different from the lead frame 2A according to the base technology in that a tie bar 29 is included instead of the tie bar 24.

The tie bar 29 links electrode terminals 21 adjacent to each other and links electrode terminals 22 adjacent to each other (refer to FIG. 1). FIG. 23 illustrates a configuration related to an electrode terminal 21. However, a configuration related to an electrode terminal 22 is similar to the configuration related to the electrode terminal 21.

As illustrated in FIG. 23, each of the electrode terminals 21 includes a root part 21g on a side of a package 1 and a tip end part 21h on a tip end side that is narrower than the root part 21g. Each of the electrode terminals 21 is connected to the tie bar 29 both on a first side surface 21a and on a second side surface 21b. However, a tie bar connection part of the first side surface 21a and a tie bar connection part of the second side surface 21b are different in position in a length direction of the electrode terminal 21. More specifically, electrode terminals 21 in which one tie bar 29 is connected to a first side surface 21a of a root part 21g and another tie bar 29 is connected to a second side surface 21b of a tip end part 21h, and electrode terminals 21 in which one tie bar 29 is connected to a first side surface 21a of a tip end part 21h and another tie bar 29 is connected to a second side surface 21b of a root part 21g, are alternately arranged. In other words, tie bars 29 connecting the tip end parts 21h to each other and tie bars 29 connecting the root parts 21g to each other are alternately arranged along an array direction of the electrode terminals 21. An orientation of each of the tie bars 29 is parallel to a width direction of the electrode terminals 21. In other words, the tie bar connection part of the first side surface 21a of each of the electrode terminals 21 and the tie bar connection part of the second side surface 21b of another electrode terminal 21 that the first side surface 21a of each of the electrode terminals 21 faces are identical in position in the length direction of the electrode terminals 21.

C-2. Terminal Molding Process

Figure 24:
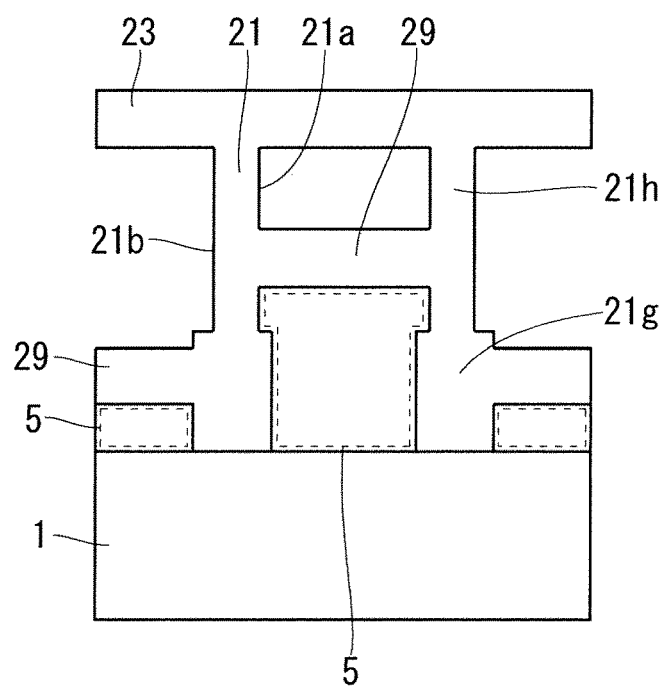
FIG. 24 is a view illustrating removal of excess resin by cutting punch in an electrode terminal molding process of the transfer-mold type IPM according to the second preferred embodiment.
Figure 25:
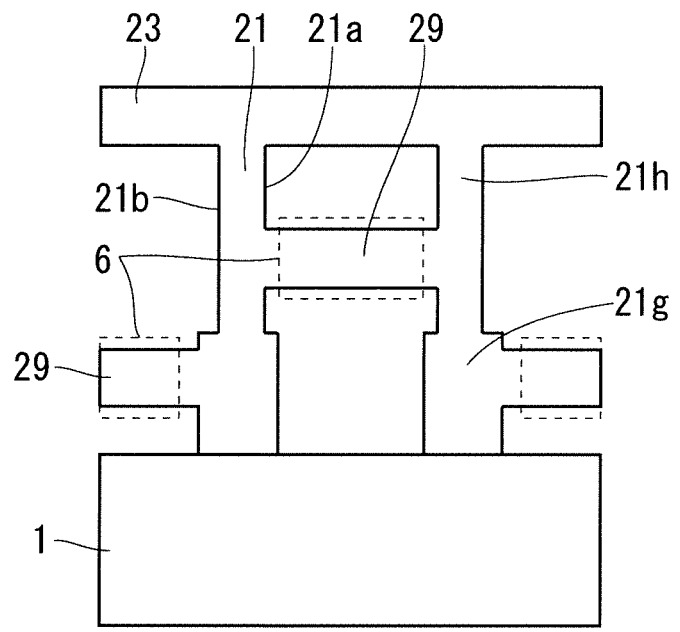
FIG. 25 is a view illustrating cutting of a tie bar by cutting punch in the electrode terminal molding process of the transfer-mold type IPM according to the second preferred embodiment.
Figure 26:
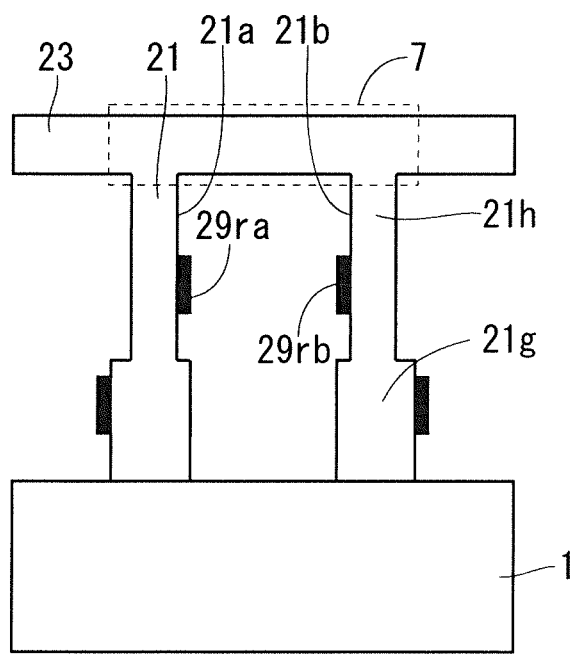
FIG. 26 is a top view illustrating the transfer-mold type IPM according to the second preferred embodiment after the tie bar is cut off.

An electrode terminal molding process of the transfer-mold type IPM according to the second preferred embodiment will be described below. First, as illustrated in FIG. 24, excess resin 3 between the package 1 and the tie bar 29 is cut off by cutting punch 5. Then, as illustrated in FIG. 25, the tie bar 29 is cut off by cutting punch 6. At this time, not an entire of the tie bar 29 is cut off, and cutting residue accrues. That is, as illustrated in FIG. 26, tie bar cutting residue 29ra is adhered to the first side surface 21a of the electrode terminal 21, and tie bar cutting residue 29rb is adhered to the second side surface 21b of the electrode terminal 21. More specifically, in an electrode terminal 21 of a first aspect, tie bar cutting residue 29ra is adhered to a first side surface of the tip end part 21h, and tie bar cutting residue 29rb is adhered to a second side surface of a root part 21g. In addition, in electrode terminals 21 of a second aspect, which are adjacent to both sides of the electrode terminal 21 of the first aspect, tie bar cutting residue 29ra is adhered to a first side surface of a root part 21g, and a tie bar cutting residue 29rb is adhered to a second side surface of a tip end part 21h. Then, the electrode terminals 21 of the first aspect and the electrode terminals 21 of the second aspect are alternately arranged.

Figure 27:
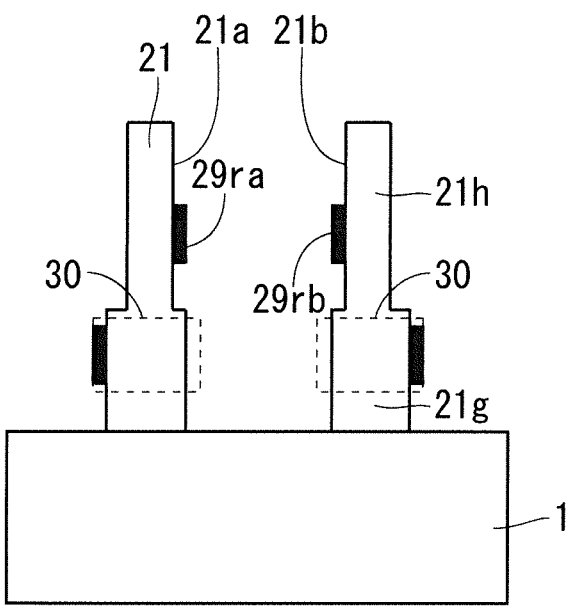
FIG. 27 is a top view illustrating the transfer-mold type IPM according to the second preferred embodiment after a frame is cut off.

Next, a frame 23 is cut off by cutting punch 7. Thus, as illustrated in FIG. 27, a link between electrode terminals 21 adjacent to each other is released. Next, a lead forming operation is applied to a broken-line region 30 including the tie bar cutting residue 29ra or the tie bar cutting residue 29rb on the root part 21g.

Figure 28:
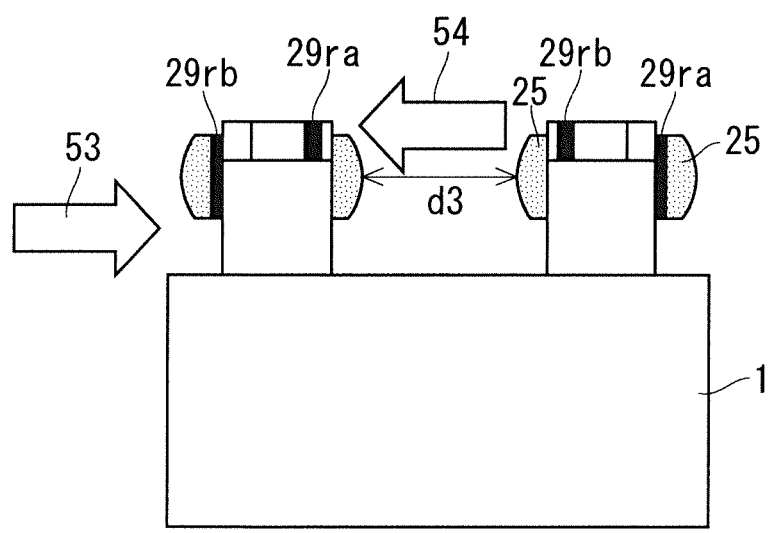
FIG. 28 is a top view illustrating the transfer-mold type IPM according to the second preferred embodiment after lead forming.
Figure 29:
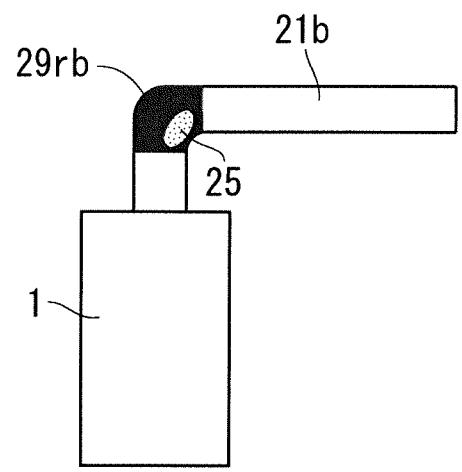
FIGS. 29 and 30 are side views each illustrating the transfer-mold type IPM according to the second preferred embodiment after lead forming.
Figure 30:
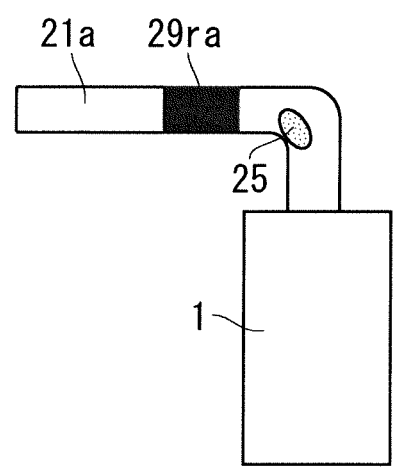
Figure 31:
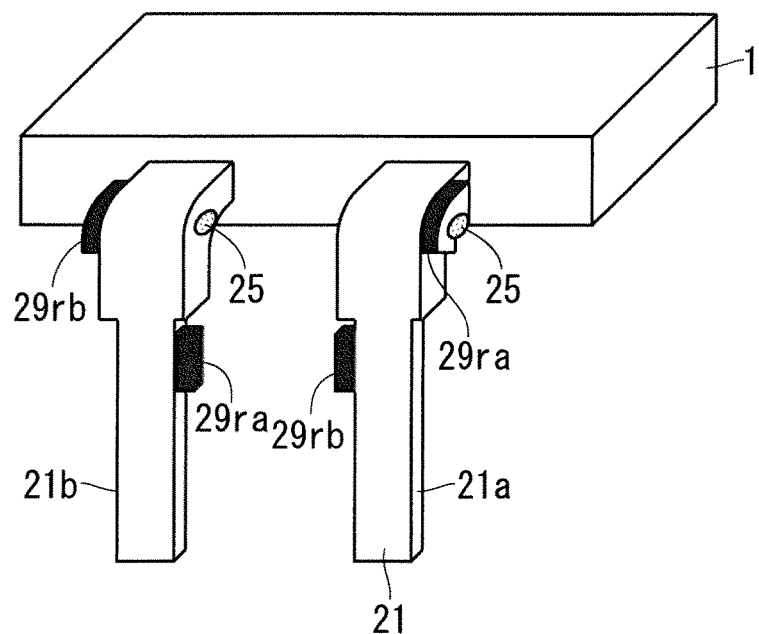
FIG. 31 is a perspective view illustrating the transfer-mold type IPM according to the second preferred embodiment after the lead forming.

FIGS. 28 to 31 illustrate the transfer-mold type IPM according to the second preferred embodiment after lead forming. FIG. 28 is a top view. FIG. 29 is a side view of the electrode terminal 21 viewed from a direction of an arrow 53 illustrated in FIG. 28. FIG. 30 is a side view of the electrode terminal 21 viewed from a direction of an arrow 54 illustrated in FIG. 28. FIG. 31 is a perspective view. Two electrode terminals 21 are illustrated in FIG. 28. In a broken-line region 30 of a left electrode terminal 21 among the two, there is no tie bar cutting residue 29ra on the first side surface 21a, and there is tie bar cutting residue 29rb on the second side surface 21b. In a broken-line region 30 of a right electrode terminal 21 among the two, there is tie bar cutting residue 29ra on the first side surface 21a and there is no tie bar cutting residue 29rb on the second side surface 21b. Therefore, on side surfaces of the two electrode terminals 21, which are facing each other, an overhang portion 25 alone is formed, and tie bar cutting residue 29ra, 29rb is not formed. Therefore, a distance d3 between these two electrode terminals 21 is longer than the distance d1 in the base technology, and an insulation clearance distance between the electrode terminals 21 is ensured.

The electrode terminal 21 on a left in FIG. 28 is adjacent to a further left electrode terminal 21 (not illustrated). The electrode terminal 21 on a right in FIG. 28 is adjacent to a further right electrode terminal 21 (not illustrated). Between these electrode terminals 21, the tie bar cutting residue 29ra, 29rb is formed on both side surfaces facing each other. Therefore, the distance d3 between the electrode terminals 21 is decreased. That is, in the transfer-mold type IPM according to the second preferred embodiment, a distance between the electrode terminals 21 of which root parts 21g are connected to each other by a tie bar 29 is decreased after terminal molding, and a distance between the electrode terminals 21 of which tip end parts 21h are connected to each other by a tie bar 29 is increased after terminal molding. Tie bars 29 connecting the root parts 21g to each other and tie bars 29 connecting the tip end parts 21h may be alternately arranged.

Alternatively, the tie bar 29 may normally connect the root parts 21g to each other, and may connect the tip end parts 21h to each other at a point to which a stricter insulation standard is applied, that is a point between specific electrode terminals 21 for which a longer insulation distance is required to be ensured. A configuration of the transfer-mold type IPM according to the second preferred embodiment is effective in a case where it is required to ensure an insulation distance between specific electrode terminals 21, which is longer than an insulation distance for another point. Limited to a point to which a stricter insulation standard is applied, a tie bar 29 can connect tip end parts 21h of electrode terminals 21 adjacent to each other. Thus, amount of excess resin 3 can be minimized, and a material cost can be reduced.

C-3. Effects

In the transfer-mold type IPM according to the second preferred embodiment, tie bar cutting residue 29ra protruding from the first side surface 21a of each of the electrode terminals 21 and tie bar cutting residue 29rb protruding from the second side surface 21b of another of the electrode terminals 21 that the first side surface 21a of each of the electrode terminals 21 faces are identical in position in the length direction of each of the electrode terminals 21. Therefore, in a case where tie bar cutting residue 29ra, 29rb, which is formed facing each other between two electrode terminals 21 adjacent to each other, is positioned closer to a tip end side of each of the electrode terminals 21 than a point where a lead forming operation is applied, the overhang portion 25 caused by a lead forming operation does not overlap the tie bar cutting residue 29ra, 29rb between the two electrode terminals 21, allowing to increase a distance between the electrode terminals 21. Therefore, it is possible to ensure an insulation clearance distance between specific electrode terminals 21.

Further, in the lead frame 2C of the transfer-mold type IPM according to the second preferred embodiment, a connection point for the tie bar 29 on the first side surface 21a of each of the electrode terminals 21 and a connection point for the tie bar 29 on the second side surface 21b of another electrode terminal 21 adjacent to each of the electrode terminals 21 are identical in position in the length direction of each of the electrode terminals 21. Therefore, if a lead frame 2C is used to mold an electrode terminal 21 of a transfer-mold type IPM, an overhang portion 25 of the electrode terminal 21 caused by a lead forming operation does not overlap with tie bar cutting residue 29ra, 29rb between side surfaces of two electrode terminals 21 facing each other, in a case where the tie bar cutting residue 29ra, 29rb, which is formed facing each other between two electrode terminals 21 adjacent to each other, is positioned closer to a tip end side of each of the electrode terminals 21 than a point where a lead forming operation is applied. Therefore, it is possible to increase a distance d2 between specific electrode terminals 21. Accordingly, it is possible to ensure an insulation clearance distance at a point to which a stricter insulation standard is applied.

D. Third Preferred Embodiment

D-1. Lead Frame

In a third preferred embodiment, when molding an electrode terminal of a transfer-mold type IPM, a lead frame 2D having a shape different from a shape of the lead frame 2A according to the base technology is used.

Figure 32:
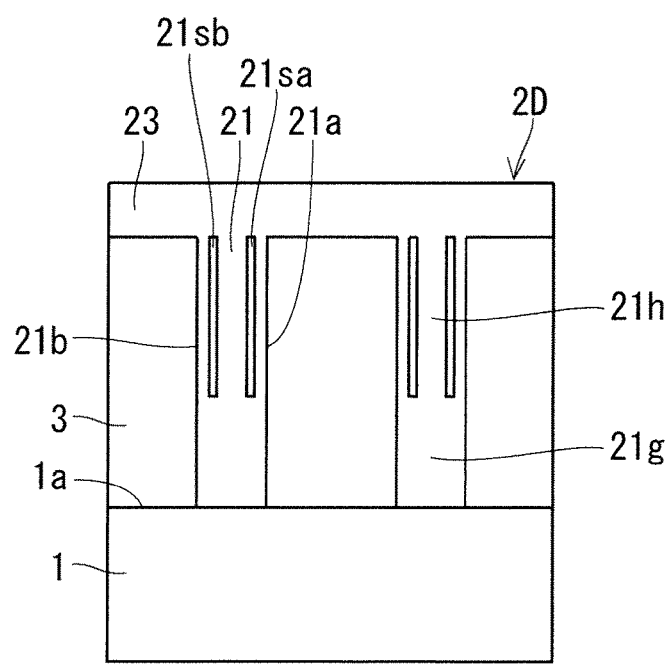
FIG. 32 is a top view illustrating a transfer-mold type IPM according to a third preferred embodiment before electrode terminal molding.

FIG. 32 is a partial top view of the transfer-mold type IPM according to the third preferred embodiment before electrode terminal molding. An electrode terminal of the transfer-mold type IPM according to the third preferred embodiment is molded out of the lead frame 2D. In FIG. 32, the lead frame 2D is different from the lead frame 2A according to the base technology in that the lead frame 2D does not include a tie bar 24 and has a slit 21sa, 21sb in an electrode terminal 21.

Each of the electrode terminals 21 is linked to each other by a frame 23 at an end part across a package 1. In the base technology or in the first or second preferred embodiment, a tie bar functions as a dam that blocks resin flowing when the package 1 is molded. However, because there is no tie bar in the present preferred embodiment, the frame 23 functions as the dam. Therefore, as illustrated in FIG. 32, there is excess resin 3 between the package 1 and the frame 23.

In an electrode terminal 21, except for in a root part 21g, the slit 21sa is formed along a first side surface 21a and the slit 21sb is formed along a second side surface 21b. The slit 21sa is formed closer to the first side surface 21a than a center of the electrode terminal 21 in a width direction, and the slit 21sb is formed closer to the second side surface 21b than the center of the electrode terminal 21 in the width direction. FIG. 32 illustrates a configuration related to an electrode terminal 21. However, a configuration related to an electrode terminal 22 is similar to the configuration related to the electrode terminal 21.

D-2. Terminal Molding Process

A manufacturing process of the transfer-mold type IPM according to the third preferred embodiment will be described below. First, a power semiconductor device is mounted on a die pad of the lead frame 2D. Then, an inside of the frame 23 is filled with resin to mold the package 1 that seals the power semiconductor device.

Figure 33:
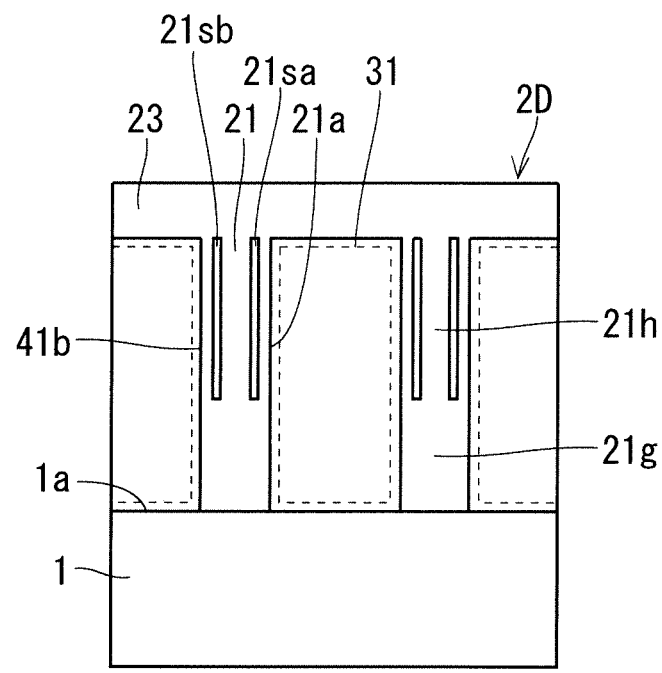
FIG. 33 is a view illustrating removal of excess resin by cutting punch in an electrode terminal molding process of the transfer-mold type IPM according to the third preferred embodiment.

Next, as illustrated in FIG. 33, excess resin 3 between the package 1 and the frame 23 is cut off by cutting punch 31.

However, the excess resin 3 is not completely cut off, and the excess resin 3 remains on both side surfaces of the electrode terminal 21.

Figure 34:
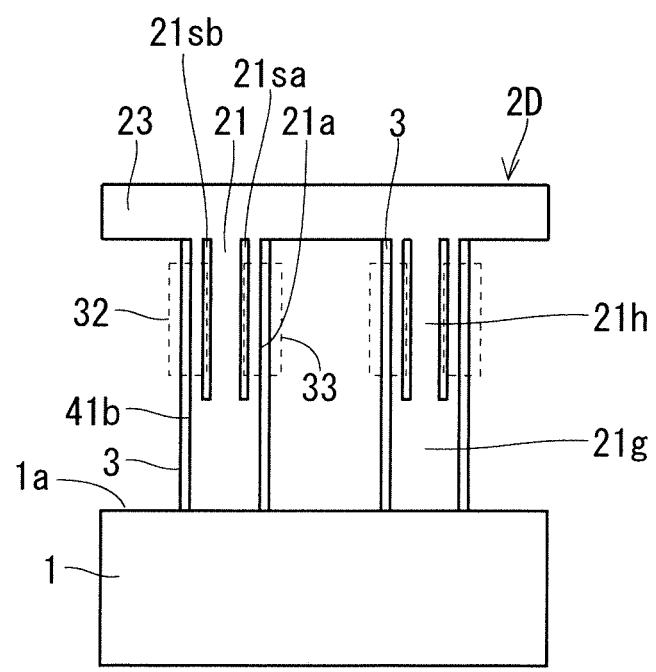
FIG. 34 is a view illustrating cutting of a side surface of an electrode terminal in the electrode terminal molding process of the transfer-mold type IPM according to the third preferred embodiment.

Therefore, as illustrated in FIG. 34, the first side surface 21a and second side surface 21b of the electrode terminal 21 are cut along the slit 21sa, 21sb with cutting punch 32, 33. As a result, the excess resin 3 is removed from the first side surface 21a and second side surface 21b of the electrode terminal 21. By removing the excess resin 3, solder wettability when soldering the electrode terminal 21 to a circuit board is improved, and high bondability can be obtained.

Further, cutting the first side surface 21a and second side surface 21b of the electrode terminal 21 along the slit 21sa, 21sb means that a cutting punch cuts the electrode terminal 21 on only two sides. As a result, damage to the electrode terminal 21 due to cutting punch can be reduced. Further, a cutting punch is less likely to be worn out, and therefore, quality deterioration, such as generation of a cutting burr or a lack of stability in cutting, can be reduced. Accordingly, lifetime of the cutting punch may be extended, and stable quality and reduction in a parts cost may be achieved.

Further, because the slit 21sa, 21sb is formed only on a tip end part 21h of the electrode terminal 21, a width of the tip end part 21h can be narrower than a width of the root part 21g by the process described above. Thus, it is possible to reduce strength degradation of a bent portion when a lead forming operation is applied to the root part 21g in a post process.

Figure 35:
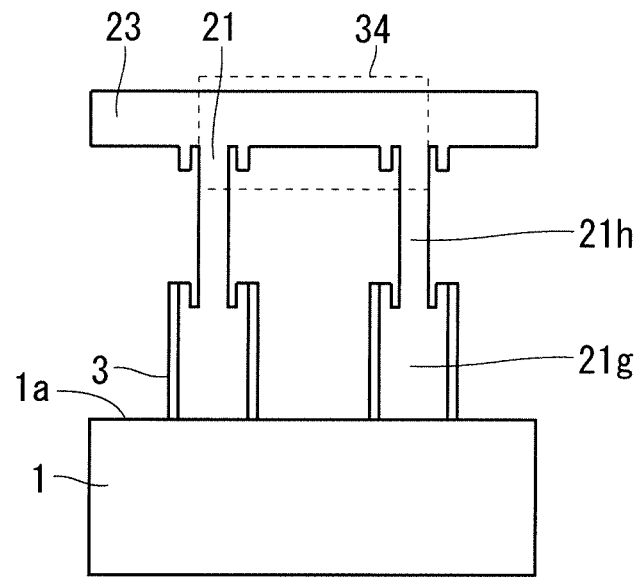
FIG. 35 is a top view illustrating the electrode terminal of the transfer-mold type IPM according to the third preferred embodiment after the side surface is cut.
Figure 36:
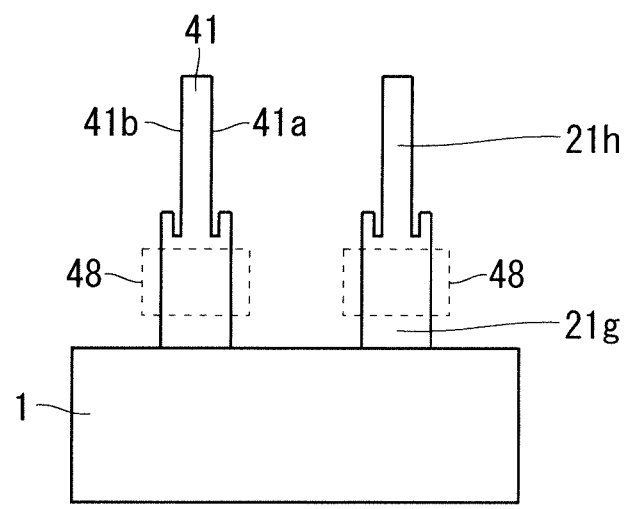
FIG. 36 is a top view illustrating the electrode terminal of the transfer-mold type IPM according to the third preferred embodiment after a frame is cut off.

Next, as illustrated in FIG. 35, the frame 23 is cut off with cutting punch 34. As a result, as illustrated in FIG. 36, a link between electrode terminals 21 adjacent to each other is released. Next, a lead forming operation is applied to a broken-line region 48 on the root part 21g illustrated in FIG. 36.

Figure 37:
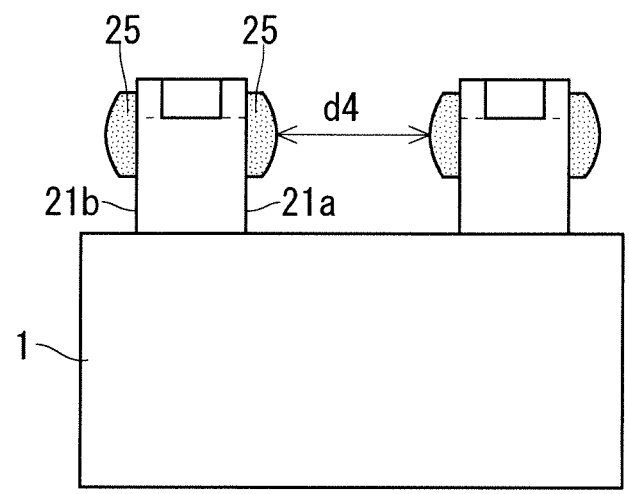
FIG. 37 is a top view illustrating the transfer-mold type IPM according to the third preferred embodiment after lead forming.
Figure 38:
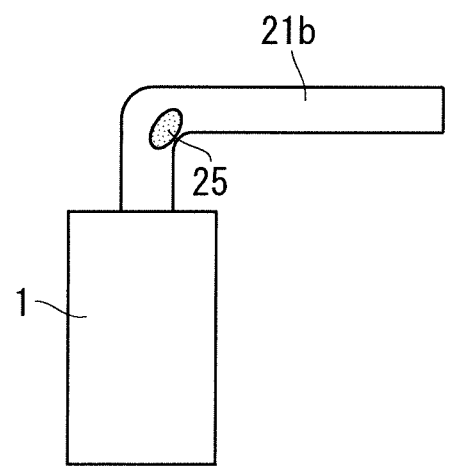
FIG. 38 is a side view illustrating the transfer-mold type IPM according to the third preferred embodiment after lead forming.
Figure 39:
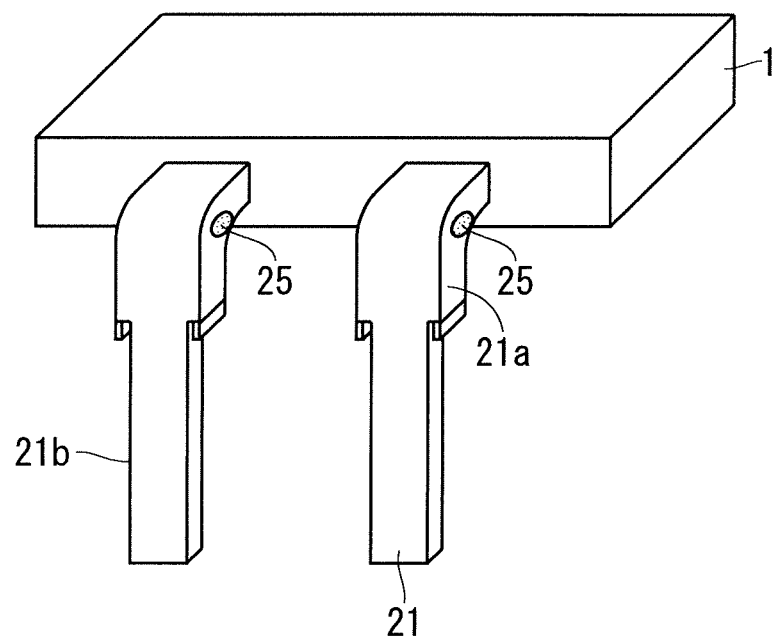
FIG. 39 is a perspective view illustrating the transfer-mold type IPM according to the third preferred embodiment after lead forming.

FIGS. 37 to 39 illustrate the transfer-mold type IPM according to the third preferred embodiment after lead forming. FIG. 37 is a top view. FIG. 38 is a side view of the electrode terminal 21 viewed from a side of the second side surface 21b. FIG. 39 is a perspective view. By the lead forming, an overhang portion 25 protrudes from the first side surface 21a and second side surface 21b of the electrode terminal 21. However, because there is no tie bar residue at a bent portion of an electrode terminal 21 in the present preferred embodiment, a distance d4 between the electrode terminals 21 can be increased compared to the distance d1 in the base technology and the distance d2 in the first preferred embodiment. Therefore, it is possible to easily ensure an insulation clearance distance between the electrode terminals 21.

D-3. Effects

The lead frame 2D for a transfer-mold type power module according to the third preferred embodiment includes a plurality of electrode terminals 21 arranged so as to protrude in the same direction from a target side surface 1a of the package 1 that mounts the power semiconductor device, and the frame 23 that links, across the package 1, end parts of each of the electrode terminals 21 and surrounds the package. Each of the electrode terminal 21 is linked to another adjacent electrode terminal 21 by the frame 23 alone. Each of the electrode terminals 21 has a first side surface 21a facing another adjacent electrode terminal 21, and a second side surface 21b opposite to the first side surface 21a, the second side surface 21b facing another electrode terminal 21 that is different from the another electrode terminal 21 that the first side surface 21a faces. Each of the electrode terminals 21 has a slit 21sa, 21sb formed along the first side surface 21a and the second side surface 21b, respectively, except for a root part that is an end part on a side of the package 1. As described above, in the lead frame 2D, the electrode terminals 21 are not linked to each other by a tie bar. Therefore, positions of an overhang portion caused by a lead forming operation and tie bar cutting residue do not overlap each other, allowing to increase a distance between the electrode terminals 21 to ensure an insulation clearance distance. Further, because a tie bar is not provided, excess resin is adhered to the first side surface 21a and second side surface 21b of the electrode terminal 21. However, the excess resin can be easily removed by cutting the first side surface 21a and the second side surface 21b along the slit 21sa, 21sb.

A method for manufacturing the transfer-mold type power module according to the present preferred embodiment includes mounting the power semiconductor device on the die pad of the lead frame 2D that includes the die pad, the plurality of electrode terminals 21 arranged so as to protrude in the same direction from the die pad, the frame 23 that links a tip end of each of the electrode terminals 21 and surrounds the die pad, filling an inside of the frame 23 with resin to mold the package 1 that seals the power semiconductor device mounted on the die pad, removing, of the resin filled inside the frame 23, excess resin 3 outside of the package 1, each of the electrode terminals 21 has a first side surface 21a facing another of the electrode terminals 21 that is adjacent, and a second side surface 21b opposite to the first side surface 21a, the second side surface 21b facing another of the electrode terminals 21 that is different from the another electrode terminal 21 that the first side surface 21a faces, the slit 21sa, 21sb is formed along the first side surface 21a and the second side surface 21b, respectively, except for the root part 21g that is an end part of the package 1, cutting the first side surface 21a and second side surface 21b of each of the electrode terminals along the slit 21sa, 21sb after removing the excess resin 3, cutting the frame 23 from each of the electrode terminals 21, and applying a lead forming operation to the root part 21g of each of the electrode terminals 21. With the method for manufacturing the transfer-mold type power module according to the present preferred embodiment, there is no tie bar cutting residue at a point to which a lead forming operation is applied, because the lead frame 2D does not include a tie bar. Therefore, it is possible to increase a distance between electrode terminals 21 and to ensure an insulation clearance distance between the electrode terminals. Further, excess resin is adhered to the first side surface 21a and second side surface 21b of the electrode terminal 21, because the lead frame 2D does not include a tie bar. However, the excess resin 3 can be easily removed by cutting the first side surface 21a and the second side surface 21b along the slit 21sa, 21sb.

The respective preferred embodiments can be freely combined, or the respective preferred embodiments can be appropriately modified or omitted.

While the disclosure has been shown and described in detail, the foregoing description is in all aspects illustrative and not restrictive. It is therefore understood that numerous modifications and variations can be devised.

What is claimed is:

1. A transfer-mold type power module comprising:
a package that seals a power semiconductor device with resin; and a plurality of electrode terminals arranged so as to protrude in the same direction from a target side surface of the package, wherein each of the electrode terminals has a first side surface facing another of the electrode terminals that is adjacent, and a second side surface opposite to the first side surface, the second side surface facing another of the electrode terminals that is different from the another electrode terminal that the first side surface faces, each of the electrode terminals has tie bar cutting residue protruding from the first side surface and the second side surface, the tie bar cutting residue protruding from the first side surface of each of the electrode terminals and the tie bar cutting residue protruding from the second side surface of each of the electrode terminals are different in position in a length direction of each of the electrode terminals, and each of the electrode terminals has a shape bent at a position including tie bar cutting residue closer to the package, with a width direction of each of the electrode terminals as an axis.

2. The transfer-mold type power module according to claim 1, wherein the tie bar cutting residue protruding from the first side surface of each of the electrode terminals and the tie bar cutting residue protruding from the second side surface of the another of the electrode terminals that the first side surface of each of the electrode terminals faces are different in position in a length direction of each of the electrode terminals.

3. The transfer-mold type power module according to claim 1, wherein the tie bar cutting residue protruding from the first side surface of each of the electrode terminals and the tie bar cutting residue protruding from the second side surface of the another of the electrode terminals that the first side surface of each of the electrode terminals faces are identical in position in the length direction of each of the electrode terminals.

\* \* \* \* \*